United States Patent [19]
Edwards, Jr. et al.

[11] Patent Number: 5,929,746
[45] Date of Patent: *Jul. 27, 1999

[54] SURFACE MOUNTED THIN FILM VOLTAGE DIVIDER

[75] Inventors: Aaron William Edwards, Jr.; Jerry Lee Seams, both of Corpus Christi; L. William Bos, Portland, all of Tex.

[73] Assignee: International Resistive Company, Inc., Corpus Christi, Tex.

[ * ] Notice: This patent issued on a continued prosecution application filed under 37 CFR 1.53(d), and is subject to the twenty year patent term provisions of 35 U.S.C. 154(a)(2).

[21] Appl. No.: 08/543,106

[22] Filed: Oct. 13, 1995

[51] Int. Cl.⁶ .................................................... H01L 1/01
[52] U.S. Cl. ...................... 338/320; 338/309; 338/325; 338/332; 338/313; 338/295; 338/288; 338/287; 338/203
[58] Field of Search .............................. 338/195, 49, 295, 338/324, 325, 328, 332, 333, 74, 203, 272, 313, 314, 287, 288, 308, 320, 192, 309; 323/298, 354

[56] References Cited

U.S. PATENT DOCUMENTS

| | | | |
|---|---|---|---|
| 3,344,387 | 9/1967 | Kinkel et al. | 338/314 |
| 3,668,600 | 6/1972 | Schuberth et al. | 338/320 |
| 3,928,837 | 12/1975 | Esper et al. | 338/32 R |
| 3,964,087 | 6/1976 | Mallon | 338/306 |
| 3,995,249 | 11/1976 | Ferry | 338/292 |
| 4,260,965 | 4/1981 | Nakamura et al. | 333/81 A |
| 4,475,099 | 10/1984 | Praria | 338/195 |
| 4,531,111 | 7/1985 | Schmidt et al. | 338/195 |
| 4,584,553 | 4/1986 | Tokura | 338/320 |
| 4,792,781 | 12/1988 | Takahashi et al. | 338/307 |
| 5,170,146 | 12/1992 | Gardner | 338/313 |
| 5,257,005 | 10/1993 | Desroches | 338/325 |
| 5,258,738 | 11/1993 | Schat | 338/332 |
| 5,285,184 | 2/1994 | Hatta | 338/313 |
| 5,339,065 | 8/1994 | Slenker | 338/133 |
| 5,408,575 | 4/1995 | Morris | 388/830 |

FOREIGN PATENT DOCUMENTS

| | | | |
|---|---|---|---|
| 3021288 | 12/1981 | Germany | 338/195 |
| 4-243101 | 8/1992 | Japan | 338/333 |
| 5-159910 | 6/1993 | Japan | 338/333 |
| 5-166611 | 7/1993 | Japan | 338/314 |
| 5-258924 | 10/1993 | Japan | 338/320 |
| 5-343212 | 12/1993 | Japan | 338/320 |
| 6-36907 | 2/1994 | Japan | 338/320 |

OTHER PUBLICATIONS

English Translation of Gidou, JP 5–343212, previously cited in Paper No. 5.
English Translation of Haneda, JP 5–258924, previously cited in Paper No. 5.

*Primary Examiner*—Michael L. Gellner
*Assistant Examiner*—Karl Easthom
*Attorney, Agent, or Firm*—G. Turner Moller

[57] ABSTRACT

A surface mounted thin film precision voltage divider is provided by incorporating two resistors on a single base of the same size and configuration as prior art surface mounted thin film precision resistors. Because the resistors were made at the same time, using the same materials and under the same conditions, the resistors react substantially equally to changes in temperature, aging, thermal shock, short time overload, high temperature exposure, resistance to bond exposure, moisture resistance, load life and low temperature operation. The voltage divider replaces two conventional surface mounted thin film precision resistors at a fraction of the cost.

7 Claims, 2 Drawing Sheets

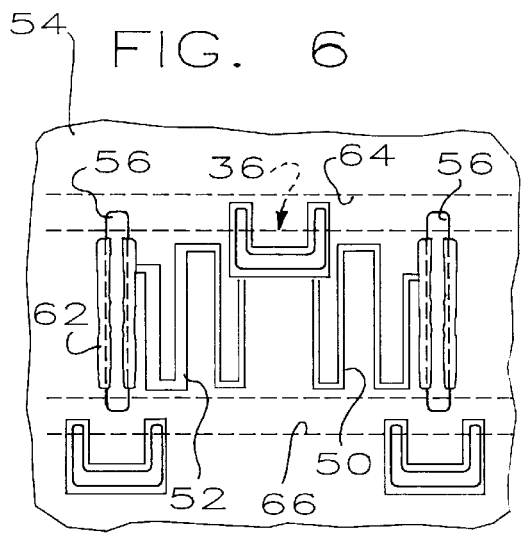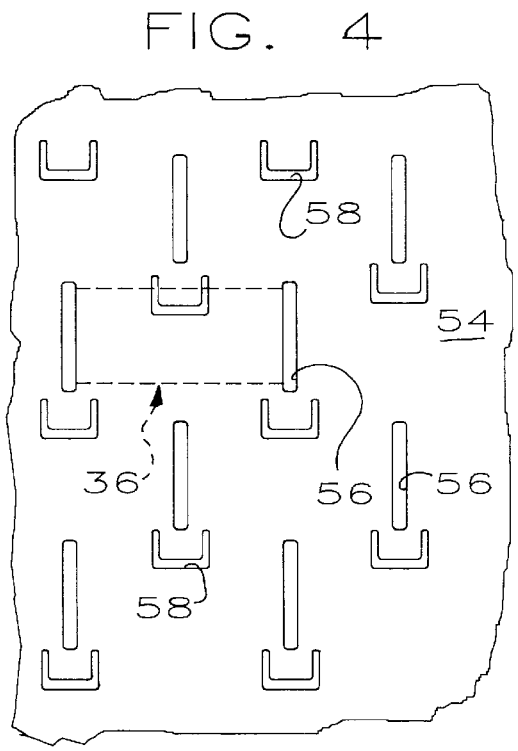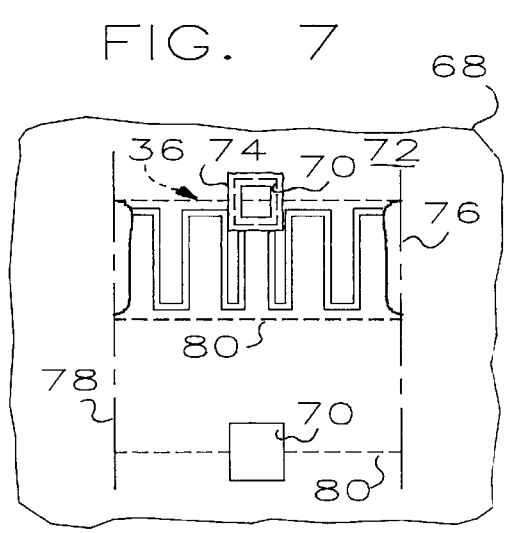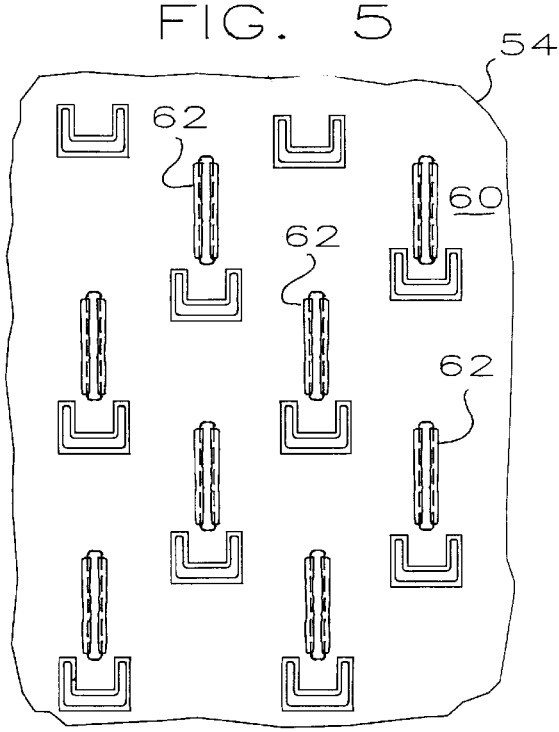

SURFACE MOUNTED THIN FILM VOLTAGE DIVIDER

This invention relates to discrete surface mounted thin film precision resistors of the type that are typically secured to circuit boards and used as voltage dividers.

BACKGROUND OF THE INVENTION

Discrete surface mounted thin film precision resistors are made in staggering numbers and are soldered by automated equipment known as pick-and-place machines onto circuit boards. Discrete surface mounted resistors include a single resistor and are made in a small number of standard sizes, all of which are tiny. For example, one standard size is known as a Model 1206 which is of rectangular shape being 0.120" on the long side and 0.060" on the short side. The pick-and-place machines are designed to accommodate surface mounted thin film resistors of the different standard sizes with a minimum adjustment of the machine. Surface mounted thin film precision resistors are universally used in electronic circuits as opposed to power circuits.

Surface mounted thin film precision resistors include a rectangular ceramic base, conductive terminals wrapping around the short sides of the base, a single resistive element which connects the conductive terminals together on the top side, and a protective coating over the resistor. The standard technique of making surface mounted thin film precision resistors is to start with a ceramic base of sufficient size to make several hundred or several thousand discrete resistors. Successive conductive and resistive layers are sputtered or vacuum deposited on the base in a repetitive pattern so several hundred or several thousand identical resistors are made on one ceramic wafer. The value of each resistor is measured and trimmed with a laser to bring the resistance to a desired value. The ceramic base is scribed with a laser or is diamond sawed to separate the substrate into the several hundred or several thousand of the individual surface mounted resistors.

The vast majority of surface mounted thin film precision resistors are used in pairs as voltage dividers so an input voltage applied across the series of the two resistors is divided into an output voltage appearing across one of them. The desired ratio of the output voltage to the input voltage depends on the design of the particular circuit being made, and the resistors are made of a value to provide the desired output.

Surface mounted resistors of this type must have resistance values within limits dictated by the particular application of the circuit involved. This is commonly expressed in a resistor specification as some percentage, plus or minus, of a predetermined value. Thus, a common resistor specification says that a resistor must have a value of 1500 ohms±0.5%. A resistor made to close tolerances would be ±0.1%.

It is not sufficient that the resistance values of the resistors simply be within a given tolerance at room temperature because the temperature at which the circuit operates may vary thereby changing the resistance values in a manner that inherently provides a larger spread of resistance values. Thus, one resistor might have a temperature coefficient of 0.005% ohms per 0° C. rise. Thus, it is necessary that resistors be made to have values which change in response to temperature in a predictable or determinable manner.

It is not sufficient that resistance values of the discrete resistors have temperature coefficients of resistance which can be predicted or determined. Resistance values also change in response to time because the resistor material, the conductors, or both, age in response to factors that are not well understood.

There are a variety of other factors, shown in Table I, which affect resistance values and which, in most applications, must be taken into account:

TABLE I

| Factor Affecting Resistance | Test Method | Δ R/R | Δ ratio |
| --- | --- | --- | --- |
| thermal shock | MIL-STD 202, Method 107 | ±.02% | ±.005% |
| short time overload | MIL-R-55342, Par 4.7.5 | ±.02% | ±.005% |
| high temp exposure | MIL-R-55342, Par 4.7.6 | ±.03% | ±.01% |
| resistance to bond exposure | MIL-R-55342, Par 4.7.7 | ±.01% | ±.01% |
| moisture resistance | MIL-STD-202, Method 106 | ±.03% | ±.02% |
| load life | MIL-STD-202, Method 108 | ±.03% | ±.01% |
| low temp operation | MIL-R-55342, Par 4.7.4 | ±.01% | +.005% |

These complications in the production of surface mounted thin film precision resistors are sometimes aggravated and sometimes alleviated by the use of resistors in pairs to provide voltage dividers. For example, in paired resistors the absolute resistance values of each resistor might vary substantially so long as their ratio remains close to the desired value. Thus, in a voltage divider, the specification might be 10:1±0.05% indicating the ratio of the input voltage to the output voltage. From elementary circuit theory, the ratio of the two resistors making up the divider network in the above example can be shown to be 9:1+/−0.0555%. In general, the percent error in the output voltage of the divider network is given by:

$$\frac{\Delta e_o}{e_o} = -\Delta\left(\frac{100 R2°}{R1° + R2°}\right) \qquad \text{equation (1)}$$

for the circuit

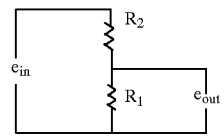

where:

R1°=nominal value of resistor 1

R2°=nominal value of resistor 2

R1=actual value of resistor 1

R2=actual value of resistor 2

$\Delta_1$=decimal deviation of resistor 1 from nominal $\Delta_2$=decimal deviation of resistor 2 from nominal $\Delta = \Delta_2 - \Delta_1$ $$\text{Thus,} \quad R1 = R1° (1 + \Delta_1)$$

-continued $$R2 = R2° (1 + \Delta_2)$$

On the other hand, changes in resistance caused by temperature change, aging, thermal shock, short time overload, high temperature exposure, resistance to bond exposure, moisture resistance, load life and low temperature operation makes problems worse. This will be apparent because one of the resistor pair may vary in one direction and the other resistor may vary in the opposite direction. Even where the resistors vary in the same direction, they will normally vary at different rates. Thus, the percentage variation of a pair of resistors can be twice the percentage variation of a single resistor. For example, if a particular resistor has a temperature coefficient of 20 ppm per 0° C. rise, and the second resistor of the divider pair has a temperature coefficient of −20 ppm per °C. rise, then the divider will have a temperature coefficient of 40 ppm per °C. rise. Thus, over a temperature range of 50° C., the voltage will change by approximately 0.2%.

Similarly, if one resistor drifts −0.05% over the life of the resistor and the second by +0.15%, the voltage ratio drift over time will be approximately 0.2%. It will be apparent to those skilled in the art that the divergence in voltage ratio specified in the above example are approximately true when the voltage ratio of the divider is on the order of 10 or more. The exact drift in voltage ratio for a given drift in R1 and R2 is given by equation (1).

To accommodate these factors, resistors have to be made to much more stringent specifications than one might expect. The effort spent in meeting more stringent specifications is reflected in the cost and thus the price of discrete surface mounted thin film precision resistors.

It will be apparent to those skilled in the art that thin film resistors are different from thick film resistors. The resistive and conductive layers on thin film resistors are normally deposited by sputtering or vacuum deposition and typically are on the order of 500–1000 Angstroms or several hundred atomic layers thick. The resistive and conductive layers on thick film resistors are normally applied by screen printing and typically are on the order of 15 micrometers or about ½ mil thick. Thick film resistors are typically much larger and carry much greater amperages than thin film resistors. Thick film resistors have much greater variations in resistance, response to temperature changes, aging, thermal shock, short time overload, high temperature exposure, resistance to bond exposure, moisture resistance, load life and low temperature operation. The reasons for these differences become apparent when reflecting on the different resistive materials and the different techniques of applying the conductive and resistive layers to the substrate. Printing a paste onto a substrate is inherently a much cheaper, less complicated, more rugged and less precise exercise than vacuum deposition or sputtering and this results in greater variation in the resistor element. Those skilled in the art know that thick film resistors have their application, thin film resistors have their application and rarely do they overlap.

It is known in the prior art to place multiple resistors on a single device. These devices are known as network or array resistors. Typically, there are one or more input connectors leading to a fair number, usually six or eight, of output connectors. Some network resistors are thick film devices such as shown in U.S. Pat. No. 5,285,184 and some are thin film resistors. For reasons which are largely historical, network resistors are not made in the same manner as thin film precision resistors, their applications rarely overlap and the technologies have evolved independently. For example, thin film precision resistors are used exclusively in electronic circuits, on circuit boards, as voltage dividers. Network resistors, on the other hand, are typically thick film devices used in loose tolerance digital applications.

Of some interest regarding this invention are the disclosures in U.S. Pat. Nos. 4,475,099; 4,505,032; 4,584,553; 5,170,146 and 5,257,005.

SUMMARY OF THE INVENTION

In this invention, a fundamental change to the basic discrete surface mounted resistor package has been created so the chip heretofore containing only one resistive element now contains two precisely matched elements. Most importantly, this invention allows the transformation of the discrete device package and function without substantial change to its size or shape.

To accomplish this, three technological innovations or insights were necessary. First was the recognition that a significant number of discrete surface mounted resistors are used in voltage divider applications where resistors were used in pairs. Second was the recognition of the inherent advantages in placing two precisely matched elements into the existing package sizes which are in widespread use. Third was the creation of the practical manufacturing technology needed to efficiently produce the device. The ability to place two resistive elements into the discrete package is a requirement of this invention. The size and shape of prior art discrete surface mounted device packages are well established and well proven. The manufacture, compatibility with pick-and-place machines, and the circuit performance both electrically and physically have enjoyed wide acceptance leading to the manufacture and sale of staggering quantities of discrete surface mounted chip resistors. Providing a two resistive element device in the same size and shape for this market has the ability to revolutionize it. Thus, this simple concept has startling and dramatic consequences.

From a technical standpoint, many of the complications of surface mounted thin film precision discrete resistors when used in pairs are alleviated. For example, the temperature response of different resistors is a function of process differences between different batches of resistors. When the two resistors of a voltage divider are made at the same time on the same tiny base, they are subjected as much as possible to the same conditions. Accordingly, the two resistors will have, to the greatest extent possible, the same resistance response to temperature. In the case of the present invention, since both resistors are created simultaneously and are located in close proximity, the composition of the resistors and the process effects on the various aspects of resistor performance, such as drift over temperature and life of the two resistors, will be very similar. Typical examples of this invention are that the temperature coefficients of the two resistors will lie within 2 ppm/°C. Thus, over a 50° C. temperature variation, the total divergence of the voltage ratio will vary less than 100 ppm or 0.01%. This is very good indeed. If the divider were constructed using two distinct chip resistors having temperature coefficients which vary by 50 ppm/°C. (which would be expected for resistors having typical 25 ppm/°C. temperature coefficients) the divergence of the voltage ratio output would be up to 2500 ppm or 0.25%. The exact values can be obtained from equation (1) for various values of R1 and R2. Similarly, the aging of the two resistors will be very similar in the case of the present invention but could be quite different if the voltage divider were constructed from two distinct resistors. This is because the normal variation during manufacturing will result in resistors from different substrates or manufacturing lots exhibiting slightly different temperature and life characteristics.

The same advantage is true with all of the other performance variables including aging, thermal shock, short time overload, high temperature exposure, resistance to bond exposure, moisture resistance, load life and low temperature operation. Because both resistors of the voltage divider are made at the same time, on the same very small base and under the same manufacturing conditions, the reaction of the resistors will be as close to equal as can be imagined. This provides important possibilities because it is no longer necessary for any particular resistor, in a voltage divider, to have closely controlled responses to a variety of factors. In a voltage divider, if both resistors act equally, the resistance ratio remains the same. Thus, the resistance ratio remains stable under a much wider variety of conditions. Thus, it may no longer be absolutely necessary to control many costly manufacturing variables because, whatever the effect on the resistance values, the effect is the same on both resistances and the ratio remains the same.

Although the technical advantages of the device of this invention are of paramount importance in many situations, there are also substantial cost advantages. The cost of making two resistors on a single base is only modestly more than the cost of making one. In addition, there are substantial advantages to the circuit board manufacturer. First, only one pick-and-place operation is necessary rather than two which halves machine time. Second, the circuit board can be redesigned because the voltage divider is only one piece rather than two. In this regard, the space savings is more than half because of the space required for the conductors. Taking all factors into consideration, the cost of a voltage divider of this invention in the end product is 40–50% of the prior art arrangement where two surface mounted thin film resistors are used. Because tens of millions of discrete surface mounted thin film precision resistors are used each year in voltage dividers, the total cost savings is immense.

Prior art thin film precision resistors are made by two slightly different techniques. In the most common technique, a solid sheet of ceramic base material is coated with resistive material to form the resistors. Each resistor is laser trimmed to value and the substrate is separated along the laser scribe lines thus providing rows of chip resistors with edges exposed where the end terminals are formed. Conductive metals are applied to the exposed edges to make the wrap-around end terminals. The resistor strips are further separated into individual chips. Additional conductive metals are then applied, typically by electroplating, to both exposed ends to complete the end terminals. This technique is presently the most economic and widely used approach of making thin film resistors.

The other technique is to start with a ceramic base that provides spaced slits corresponding to the short sides of the base of the finished resistors. The base is coated with suitable resistive materials to provide the resistors. Conductive metals are sputtered or vacuum deposited to coat the edge of the slits and the adjacent base material, thereby providing the end terminals. The resistors are measured and then laser trimmed to specification. The base is then cut by a diamond saw or a laser to separate the individual resistors from the base material.

In one embodiment of this invention, ceramic wafers are used providing slits corresponding to the short sides of the base of the finished voltage divider. Openings are provided between the slits that open through what will be one of the long sides of the finished base. A resistive material is sputtered or vapor deposited on the wafer to provide a first resistor extending from the central terminal to one end terminal and a second resistor extending from the central terminal to the other end terminal. A conductor is sputtered or vapor deposited on the wafer to provide a series of end terminals extending through the slits and wrapping around the short sides of the finished base and a series of center terminals extending through both sides of the openings on the long sides. The resistor pattern deposited on the wafer is designed so it can be trimmed by the laser to provide the desired resistance value.

The other technique of manufacturing thin film precision resistors can be employed in this invention. The simplest approach is to provide the base with a series of notches or openings near the center of what will ultimately be the long side of the resistor. After the resistive material is deposited, a first conductive coating operation is performed to deposit conductive metals in and adjacent the notches. The end terminals may then be made in the conventional manner and, when the individual resistors are separated from a length of the resistors, the side terminal will be created.

In making a conventional surface mounted thin film precision resistor, the wafer is placed in a laser trimmer which measures the resistance of each resistor and trims it, if necessary, to provide the desired value. In this invention, the laser trimmer determines the ratio of the resistors and normally trims only one resistor of the pair to a precise value. In a batch of wafers containing conventional surface mounted thin film precision resistors, the laser trimmers must trim all of the resistors to a precise value. In a comparable batch of wafers containing voltage dividers of this invention, only 50% of the resistors would be trimmed to a precise value. The other 50% would be trimmed to a less precise value which can be accomplished must faster.

The wafers are then diamond sawed to separate the substrate into the individual voltage dividers which, after the usual additional manufacturing steps of solder plating and testing, are placed in pockets of a conventional carrier tape and then wound up on a reel. The carrier pockets are of the same size, shape and configuration as now used on pick-and-place machines which install discrete chip resistors so the voltage dividers of this invention are placed on circuit boards in the same manner as the prior art surface mounted discrete thin film precision resistors.

It is an object of this invention to provide an improved voltage divider in a preexisting discrete package.

Another object of this invention is to provide a voltage divider which is less subject to ratio variations caused by different responses of the resistors to operational factors.

Another object of this invention is to provide a voltage divider having substantial cost advantages over the prior art.

These and other objects of this invention will become more fully apparent as this description proceeds, reference being made to the accompanying drawings and appended claims.

BRIEF DESCRIPTION OF THE DRAWINGS

FIG. 4 is an enlarged plan view of part of a ceramic wafer used in the manufacture of the voltage divider of this invention;

FIG. 5 is an enlarged plan view of the ceramic wafer of FIG. 4 at a later stage in the manufacturing operation;

FIG. 6 is an enlarged plan view of the ceramic wafer of FIG. 5 at a later stage in the manufacturing operation; and FIG. 7 is an enlarged plan view of an alternate substrate used to provide voltage dividers of this invention.

DETAILED DESCRIPTION

Figure 1:
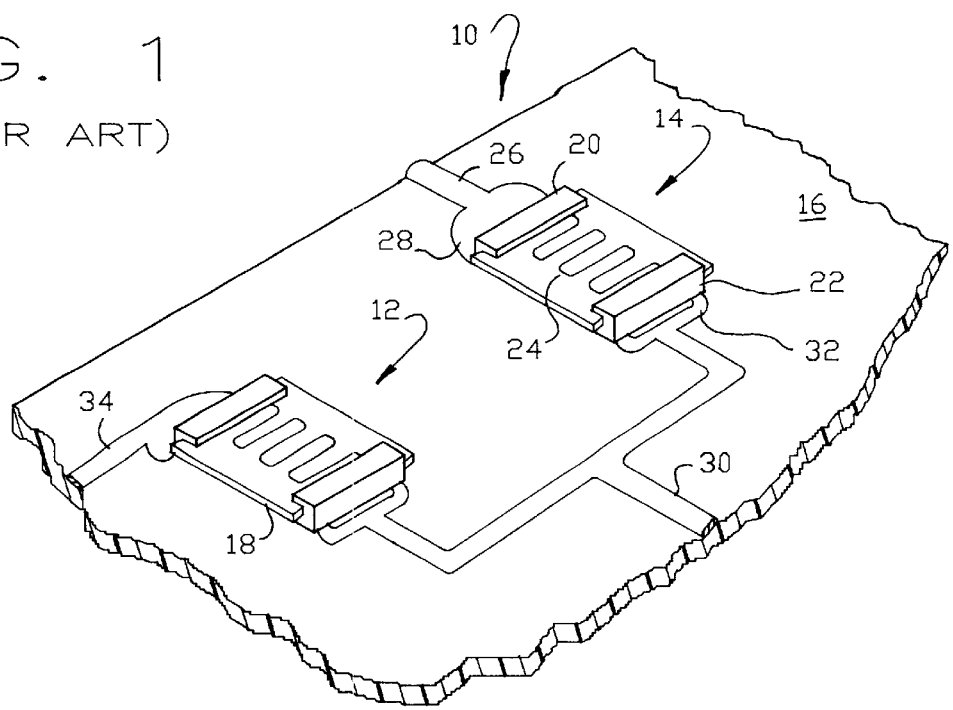
FIG. 1 is a plan view of a voltage divider of the prior art.

Referring to FIG. 1, a prior art voltage divider 10 comprises a pair of surface mounted thin film resistors 12, 14 which have been placed on a circuit board 16 by a conventional pick-and-place machine. The resistors 12, 14 include a ceramic base 18, a pair of end terminals 20, 22 and a resistive element 24 connecting the end terminals 20, 22. An input lead 26 connects to solder fillet 28 bonding the input end terminal 20 of the resistor 14 to the circuit board 16. An output lead 30 connects to a solder fillet 32 bonding the output terminal 22 of the resistor 14 to the circuit board 16. A lead 34 is the common which serves both as an input and an output.

The voltage appearing on the output leads 30, 34 will be seen to depend on the voltage appearing on the input lead 26 and the absolute resistance value of the resistors, i.e. the voltage on the lead 30 depends on the value of the resistor 12 and on the value of the resistor 14. A protective coating (not shown) may be applied to the front, top or upper surface of the resistors 12, 14 to protect the conductors 20, 22 and the resistive element 24.

As will be apparent to those skilled in the art, the materials used as the conductors 20, 22 have been widely used for years. Typical materials include copper, nickel and gold. Similarly, the materials used for the resistive element 24 are old and well known, such as tantalum nitride and Nichrome.

Figure 2:
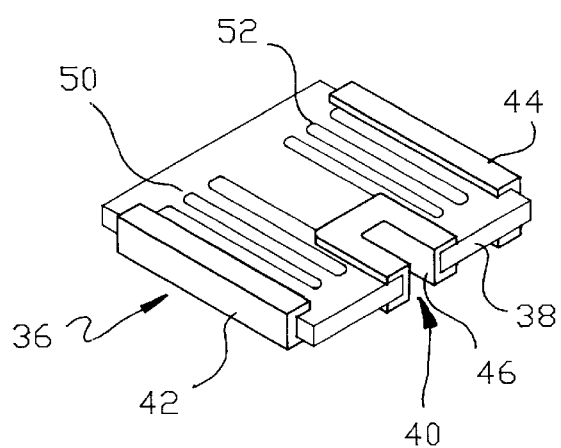
FIG. 2 is an enlarged isometric view of the voltage divider of this invention.

Referring to FIG. 2, a voltage divider 36 of this invention includes a ceramic base 38 of planar rectilinear shape having a front, a back, a pair of short parallel sides, and a pair of long parallel sides and an recess or via 40 adjacent, and preferably opening through, one of the long sides. The base 38 is the same size as the base 18 of the single resistors 12, 14 shown in FIG. 1, and is illustrated as a Model 1206, being 0.120" on the long sides and 0.060" on the short sides. A conductor or end terminal 42 wraps around one of the short sides and a conductor or end terminal 44 wraps around the other short side providing end terminals for the voltage divider 36. A conductor, a third or central terminal 46 extends through the recess or opening 40, overlaps the front and back of the ceramic base 38 as shown in FIG. 2 and provides a large conductive pad or third conductor segment 48 on the back of the base 38. A first resistor 50 connects the third or central terminal 46 to the end terminal 42 and a second resistor 52 connects the central terminal to the end terminal 44.

The terminal 46 is preferably on one of the long sides of the base 38, as opposed to the center of the base 38, because the terminal 46 is typically connected to a circuit board with a fillet of solder on the side. The solder fillet makes electrical connection to a path on the circuit board and also provides mechanical strength. With the terminal 46 on the side, the fillet can be visually inspected.

Figure 3:
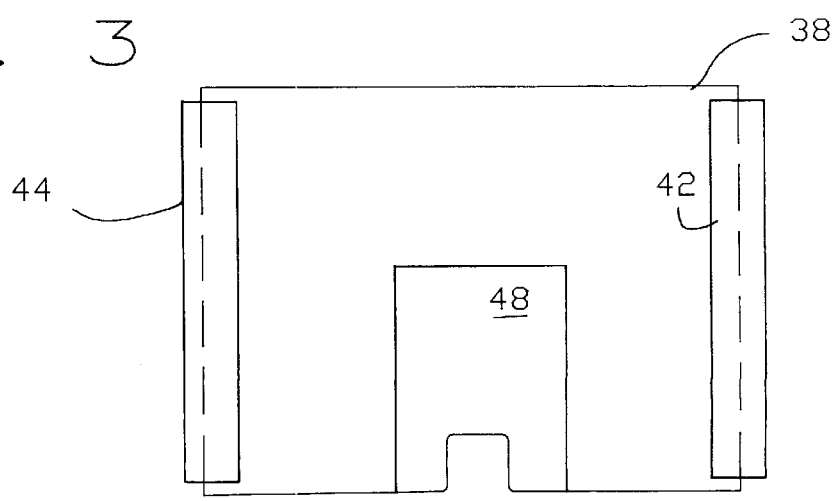
FIG. 3 is a bottom view of the voltage divider of FIG. 2.

It will be seen that the terminal 46 includes a first conductor segment on the front or top of the base 38 connected to the resistors 50, 52, a second conductor segment in the recess 40 and a third conductor segment 48 on the bottom or back of the base 38. The bottom segment 48 of the center terminal 46 is formed simultaneously with the bottom segments of the terminals 42, 44 during routine processing. The segment 48 on the bottom of the base 38 is conveniently present with an area larger than the area created by the recess as FIG. 3 shows to allow testing of the voltage divider 36 during the process of manufacture because typical test fittings have a bottom engaging contact.

In use, a series of the voltage dividers 36 are provided on an carrier tape. A pick-and-place machine takes each successive voltage divider 36 off the tape and solders it in position to a circuit board with three solder droplets. One of the droplets bonds the terminal 46 and pad 48 to an output connection and a second droplet bonds the terminal 44 to an input connection. The common connection is bonded to the terminal 42 by the third droplet. It will be seen that the voltage appearing in the output connection is a function of the absolute value of the resistors 50, 52, which may be the same but which are normally different. Importantly, in this invention, the resistors 50, 52 were made at the same time, on the same base, with the same materials and under the same conditions. Thus, any change in the resistance values in response to an external condition will occur at the same rate in both resistors 50, 52.

The manufacturing advantage of using the voltage divider 36 in lieu of two separate conventional surface mounted thin film precision resistors 12, 14 will be immediately apparent.

An important feature of this invention is to provide voltage dividers in sizes which heretofore have been widely used for chip type discrete precision thin film resistors. This enables conventional pick and place equipment to be used, without modification, to set voltage dividers of this invention onto circuit boards with minimum change in circuit board manufacturing procedure. Accordingly, voltage dividers of this invention are manufactured in many sizes, most predominate of which are shown in Table I.

TABLE I

| Industry model | length, mils | width, mils |
| --- | --- | --- |
| 2512 | 252 | 120 |
| 2010 | 200 | 100 |
| 1206 | 120 | 60 |
| 0805 | 80 | 50 |
| 0603 | 60 | 30 |

Referring to FIGS. 4–6, the resistor 36 is made from a flat ceramic wafer 54 which has been laser cut to provide a series of staggered linear slits 56 and a series of staggered U-shaped openings 58. As will become more fully apparent momentarily, the ends of the finished resistor 36 are provided by the slits 56 and the recess 40 is provided by the openings 58 as suggested in dashed lines in FIG. 4.

As shown in FIG. 5, the wafer 54 has been coated with a thin film 60 of suitable resistive material such as tantalum nitride and then overcoated with titanium-palladium as is conventional with discrete chip type surface mounted thin film resistors. The wafer 54 is masked and a conductive material 62 is electroplated onto the wafer 54 in a conventional manner to form the end terminals 42 and the central terminal 46. The wafer 54 is etched and then heat stabilized, also in a conventional manner.

The wafer 54 is placed in a laser trimmer and the resistors 50, 52 cut and trimmed as suggested in FIG. 6. The wafer 54 is screen printed with a protective coating. A solder conductor is then applied by electroplating or any other suitable manner to the terminals 40, 42, 44.

The ceramic wafer 54 is attached to a tough flexible plastic backing material on a rigid sheet. The wafer 54 is then cut with a diamond saw along the score lines 64, 66. This separates each of the resistors 36 from the wafer 54 so each of the resistors 36 is separately attached to the plastic backing. A conventional machine then separates each of the resistors 36 from the plastic backing material. The resistors 36 are then placed in line on a conventional carrier tape suitable for use in conventional pick-and-place machines. Other than the provision of the opening 58, the formation of the central terminal 40 and the provision of the two resistors 50, 52, those skilled in the art will recognize this process as typical of the less common manufacturing technique used to make discrete chip type thin film resistors.

The more common manufacturing technique can also be used in this invention as shown in FIG. 7. The starting wafer 68 is provided with openings 70 analogous to the openings 58. The wafer 68 is coated with a resistive material 72 and steps taken to electroplate terminals 74 in the openings 70 in a manner similar to that described above.

After laser trimming all resistors to value, an edge of the base is cut along lines 76, 78 to expose the area where the end terminals 42, 44 are to be provided to one row of resistors. Conductive metals are applied to both exposed edges by sputtering or other suitable technique to make the end terminals 42, 44 along a strip of the resistors. The individual resistors 36 are then separated, as by breaking along score lines 80, leaving a recess in one edge of each resistor. It will be seen that the score lines essentially bisect the openings 70 so that the central terminals 74 of adjacent resistors face each other during manufacture rather than the situation in the embodiment of FIGS. 4–6 where the openings 58 of adjacent resistors are unrelated. Nickel and solder terminations are then applied by electroplating to the short sides to connect the top and bottom sides. Because the intent is to break the resistors along the score lines 80, the openings 70 were made rectangular. It will be seen that the resistors made from the different techniques are, for practical purposes, indistinguishable.

Although this invention has been disclosed and described in its preferred forms with a certain degree of particularity, it is understood that the present disclosure of the preferred forms is only by way of example and that numerous changes in the details of construction and operation and in the combination and arrangement of parts may be resorted to without departing from the spirit and scope of the invention as hereinafter claimed.

I claim:

1. A discrete surface mounted thin film voltage divider comprising a rectilinear ceramic base having a front, a back, first and second parallel short sides having an uninterrupted first planar face perpendicular to the base, and first and second parallel long sides having a recess extending through the base from the front of the base to the back of the base;

first and second end terminals including a conductor wrapped about the short sides of the base and providing a first conductor segment bonded to the front of the base, a second conductor segment bonded to the back of the base and a third conductor segment bonded to the first planar face, the conductor extending from adjacent the first long side to adjacent the second long side;

a third-terminal, bonded to the base and being on the first long side of the base, including another first conductor segment on the front of the base and another second conductor segment bonded to the recess, and another third conductor segment on the back of the base, the another conductor segment third having an area larger than an area created by the recess on the back of the base;

a first thin film resistor on the front of the base electrically connecting the third terminal to the first end terminal; and a second thin film resistor on the front of the base electrically connecting the third terminal to the second end terminal;

the only electrical connection extending away from the first end terminal being toward the third terminal and being through the first thin film resistor and the only electrical connection extending away from the second end terminal being toward the third terminal and being through the second thin film resistor, wherein the first and second thin film resistors are the only resistors on the base, and the first, second, and third terminals are the only terminals on the base.

2. The discrete surface mounted thin film voltage divider of claim 1 wherein the long sides are 0.120 inches long and the short sides are 0.060 inches long.

3. The discrete surface mounted thin film voltage divider of claim 1 wherein the third terminal is located midway between the first and second end terminals.

4. The discrete surface mounted thin film voltage divider of claim 1 wherein the first and second end terminals include a U-shaped thin film conductor having first and second legs receiving the short sides of the base, the U-shaped thin film conductor extending from adjacent the first long side of the base to adjacent the second long side of the base.

5. The discrete surface mounted thin film voltage divider of claim 1 wherein the third conductor segment of the first and second terminals is a thin film conductor.

6. The discrete surface mounted thin film voltage divider of claim 1 wherein the first thin film resistor is of serpentine shape.

7. The discrete surface mounted thin film voltage divider of claim 6 wherein the second thin film resistor is of serpentine shape.

* * * * *